(12) United States Patent
Hayashizaki et al.

(10) Patent No.: US 8,975,908 B2
(45) Date of Patent: Mar. 10, 2015

(54) ELECTRICAL TEST PROBE AND PROBE ASSEMBLY WITH IMPROVED PROBE TIP

(75) Inventors: Takayuki Hayashizaki, Aomori (JP); Akira Soma, Aomori (JP); Hideki Hirakawa, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 258 days.

(21) Appl. No.: 13/235,155

(22) Filed: Sep. 16, 2011

(65) Prior Publication Data

US 2012/0068726 A1    Mar. 22, 2012

(30) Foreign Application Priority Data

Sep. 17, 2010   (JP) ................................. 2010-208822

(51) Int. Cl.
*G01R 1/067* (2006.01)
*G01R 1/073* (2006.01)

(52) U.S. Cl.
CPC ........ *G01R 1/06738* (2013.01); *G01R 1/06716* (2013.01); *G01R 1/07307* (2013.01)
USPC .................................... 324/755.01

(58) Field of Classification Search
CPC ............ G06F 3/03545; G01R 1/07357; G01R 1/0483; G01R 1/06733; G01R 1/06738; G01R 1/07314; G01R 1/07342; G01R 1/0735; G01R 1/07371; G01R 1/07392; G01R 31/2886; G01R 31/2887; G01R 31/2889
See application file for complete search history.

(56) References Cited

U.S. PATENT DOCUMENTS

| 5,974,662 | A  | * | 11/1999 | Eldridge et al. ............... 29/842 |
| 6,183,268 | B1 | * | 2/2001  | Consoli et al. .................. 439/74 |
| 6,967,493 | B2 | * | 11/2005 | Mori et al. ............... 324/756.03 |
| 7,567,089 | B2 | * | 7/2009  | Chen et al. ............... 324/755.11 |
| 2008/0074128 | A1 | | 3/2008 | Hirakawa et al. |
| 2011/0043192 | A1 | * | 2/2011 | Liu ............................... 324/149 |

FOREIGN PATENT DOCUMENTS

| JP | 2003177143 | 6/2003 |
| JP | 2013177143 | 6/2003 |
| JP | 2008-082718 | 4/2008 |
| JP | 2008145238 | 6/2008 |
| KR | 1020080028274 | 3/2008 |
| WO | 2006075408 | 7/2006 |

\* cited by examiner

*Primary Examiner* — Vinh Nguyen
(74) *Attorney, Agent, or Firm* — Bryan A. Santarelli; Lane Powell PC

(57) ABSTRACT

An embodiment disperses a force acting on a border portion between an extending portion and a pedestal portion or a reinforcing member to prevent breakage of a probe tip portion of a probe. An electrical test probe includes a probe main body, a recess provided at an end of the main body and having an inner surface, and a probe tip having a part received in the recess. The inner surface has a central area and two lateral areas on both sides of the central area, and the part of the probe tip is located at the central area and at least at either one of the lateral areas.

11 Claims, 10 Drawing Sheets

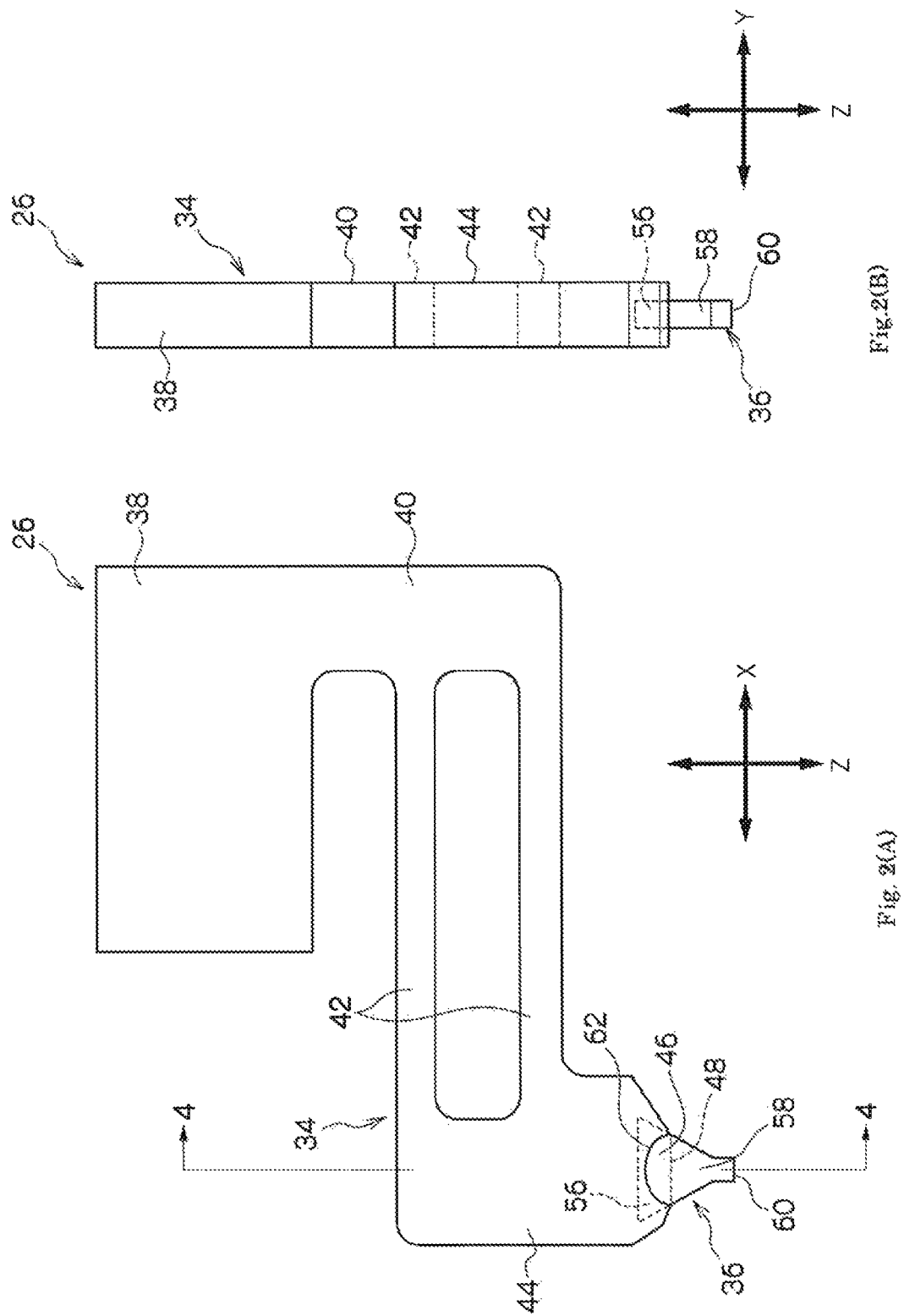

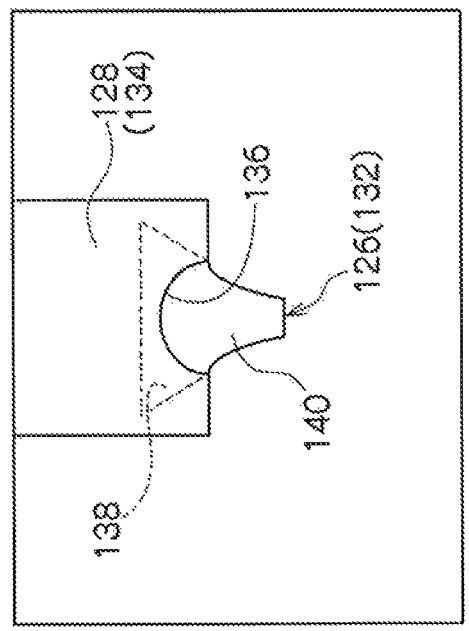
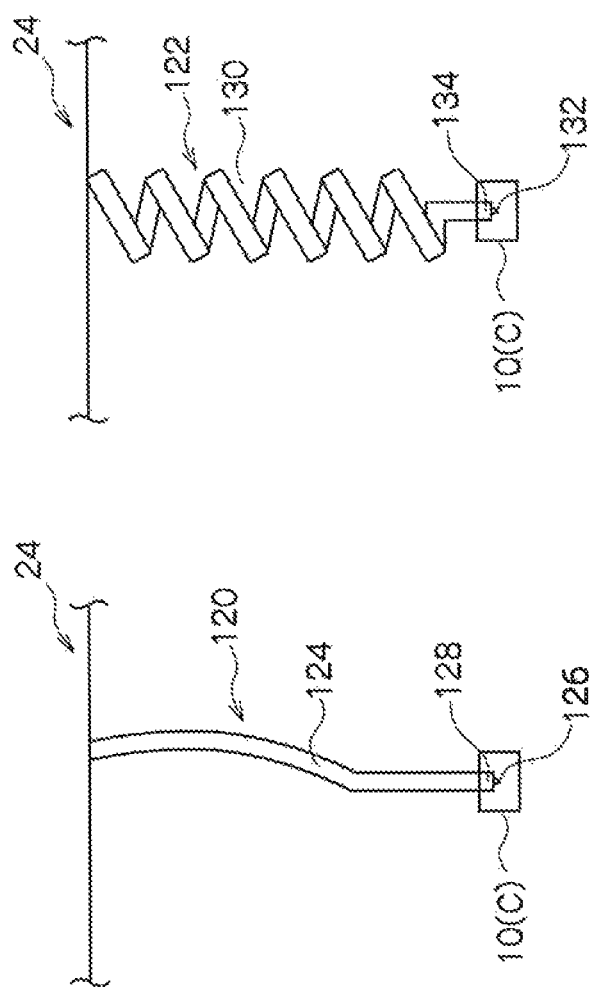

ELECTRICAL TEST PROBE AND PROBE ASSEMBLY WITH IMPROVED PROBE TIP

PRIORITY CLAIM

This instant application claims priority to Japanese Patent Application No. 2010-208822, filed Sep. 17, 2010, which application is incorporated herein by reference in its entirety.

TECHNICAL FIELD

An embodiment of the subject matter relates to a probe for use in an electrical test of a plurality of semiconductor integrated circuits formed on a semiconductor wafer and a probe assembly to which this probe has been provided.

BACKGROUND

A plurality of semiconductor integrated circuits formed on a semiconductor wafer undergo an electrical test before being separated into respective chips to determine whether or not they are manufactured in accordance with the specification. In this electrical test, an electrical connecting apparatus including electrical test probes to be coupled to electrodes of devices under test that are the respective semiconductor integrated circuits is used. The devices under test are coupled to electrical circuits of a tester via this electrical connecting apparatus.

As one of conventional probes used for this electrical connecting apparatus, there is one including a plate-like probe main body portion and a probe tip portion provided on the probe main body portion to contact on an electrode of a device under test (for example, refer to International Publication WO2006/075408, which is incorporated by reference). The probe main body portion has a rectangular attaching portion attached to a probe board, a connecting portion extending downward from one side of the attaching portion, a pair of arm portions extending in a front-back direction from the connecting portion below the attaching portion, and a pedestal portion formed integrally with the arm portions so as to combine tip ends of both the arm portions. Also, the probe tip portion has a coupling portion coupled with the pedestal portion by being buried or fitted in the pedestal portion and an extending portion continuing into the coupling portion and extending downward from the pedestal portion.

According to the probe in International Publication WO2006/075408, it is proposed that the probe main body portion should be made of a highly resilient conductive material, and the probe tip portion provided at a lower end of the pedestal portion of the probe main body portion should be made of a metal material with excellent hardness. By forming the probe main body portion by the highly resilient metal material, elastic deformation of the arm portions of the probe main body portion is enhanced when the probe tip portion of the probe is thrust to the electrode of the device under test, which enables the probe tip portion to couple the electrode appropriately and reliably.

Also, when an overdriving force that causes the aforementioned elastic deformation at the arm portions acts on the probe, a probe tip of the probe tip portion slides on the electrode along with the elastic deformation of the arm portions. By forming this probe tip portion by the highly hard material, abrasion of the probe tip is suppressed, and durability of the probe is enhanced.

Meanwhile, in a case where multiple chip areas on a wafer undergo an electrical test per chip area in several batches with use of the electrical connecting apparatus including the aforementioned multiple probes, the probe tips of some probes that deviate from the chip area may sometimes contact a tilting edge of the wafer in a state where the overdriving force acts on the probes. In such a case, when the probe tips are guided outward along the tilting edge of the wafer, the probe tip portions of the probes will receive a bending force. Also, when the probe tip of the probe contacts an edge of an opening edge portion, which exposes the electrode, of a passivation film covering a surface of the semiconductor wafer, the probe tip portion may sometimes receive a similar bending force.

These bending forces may act on a border portion between the pedestal portion of the probe main body portion and the extending portion extending from the pedestal portion and cause breakage of the probe tip portion at the border portion. In the probe in International Publication WO2006/075408, since the border portion between the extending portion and the pedestal portion is in a linear manner, the bending forces will act on the linear border portion, especially a central area thereof, in a concentrated manner when the bending forces act on the probe, which may lead to breakage of the probe tip portion.

As one of the electrical test probes that prevent such breakage of the probe tip portion, there is an electrical test probe provided with a reinforcing member at the border portion between the pedestal portion and the extending portion (Japanese National Patent Appln. Public Disclosure No. 2008-82718, which is incorporated by reference).

In this electrical test probe, when a bending force that deforms the probe tip portion toward the probe tip reinforcing portion acts on the probe, the probe tip reinforcing portion receives part of the bending force to decrease the bending force acting on the border portion and brings about a reinforcing effect on the probe tip portion.

However, in this conventional technique, the bending force acting on the border portion between the extending portion and the pedestal portion is decreased, but a new bending force acts on a border portion between the extending portion and the reinforcing member. Thus, the probe may be broken at the border portion between the extending portion and the reinforcing member.

SUMMARY

An embodiment of the subject matter disperses a force acting on a border portion between an extending portion and a pedestal portion or a reinforcing member to prevent breakage of a probe tip portion.

An embodiment of the subject matter to disperse a force acting on a border portion between a probe main body portion and the probe tip portion to prevent breakage of the probe tip portion.

An electrical test probe according to an embodiment of the subject matter includes a probe main body portion, a plate-like pedestal portion that is provided at the probe main body portion and whose right-left direction is a thickness direction, and a probe tip portion that extends downward from the pedestal portion and whose lower end is a tip end to contact on a device under test. The pedestal portion has a recess opened at least downward and defined by a central area opposed to an open surface thereof and lateral areas continuing into respective ends of the central area in a front-back direction and reaching open ends of the recess from the central area.

The probe tip portion may be made of a harder material than that of the pedestal portion and has a coupling portion coupled with the pedestal portion by being buried or fitted in the pedestal portion and a plate-like extending portion extending downward from the recess. The extending portion has a border portion contacting the recess from the central area to the respective lateral areas and the tip end and has a smaller thickness dimension than a thickness dimension of the recess.

The central area and the lateral areas may collectively form one arc surface extending in a front-back direction, and the coupling portion may be located approximately at a center of the recess in a right-left direction.

A probe assembly according to an embodiment of the subject matter includes a probe board having a plurality of probe lands on a lower surface, and a plurality of probes attached to the probe lands, and the plurality of probes are the aforementioned electrical test probes.

The probe may be attached to the probe land in a cantilevered manner.

A probe according to another embodiment of the subject matter comprises a probe main body portion, a recess provided at an end of the probe main body portion and having an inner surface, and a probe tip portion having a part received in the recess, and the inner surface has a central area and two lateral areas on both sides of the central area, and the part of the probe tip portion is located at the central area and at least at either one of the lateral areas.

A zone of the central area and the lateral areas at which the part of the probe tip portion is located may be in an arc along a first direction in which the central area and the lateral areas are arranged.

The probe tip portion may be in a plate shape perpendicular to the inner surface, and the part of the probe tip portion may be located at a center of the inner surface in a second direction perpendicular to the first direction of the inner surface.

A probe assembly according to another embodiment of the subject matter includes a plurality of probes wherein each probe has a probe main body portion, a recess provided at an end of the probe main body portion and having an inner surface, and a probe tip portion having a part received in the recess and wherein the inner surface has a central area and two lateral areas on both sides of the central area, and the part of the probe tip portion is located at the central area and at least at either one of the lateral areas, and a probe board to which the probes are attached.

According to an embodiment of the subject matter, the border portion of the pedestal portion and the extending portion is formed by the extending portion and the recess so that the extending portion may extend from the central area and the respective lateral areas of the recess. Thereby, a dimension of the border portion in a front-back direction is longer than in a case of a linear border portion.

Thus, when the probe tip portion according to an embodiment receives a force (bending force) in a right-left direction, the bending force is dispersed and acts on an entire area of the long border portion. Consequently, concentration of the bending force acting on the border portion is alleviated, and thus the probe is prevented from being broken at the border portion of the pedestal portion and the extending portion.

Also, according to an embodiment of the subject matter, since the probe tip portion of the probe continues via the inner surface of the recess, the force acting on the border portion of the probe main body portion and the probe tip portion is suitably disperses on the inner surface. Accordingly, breakage of the probe tip portion at the border portion can be prevented favorably.

BRIEF DESCRIPTION OF THE DRAWINGS

FIGS. 2(A) and 2(B) illustrate an embodiment of the probe according to an embodiment of the subject matter, FIG. 2(A) is a front view, and FIG. 2(B) is a side view seen from a front side (pedestal portion direction).

FIG. 3(B) illustrates a state in which an extending portion has been removed from FIG. 3(A).

FIGS. 10(A) and 10(B) are schematic views illustrating second and third embodiments of the probe according to an embodiment of the subject matter, and FIG. 10(C) is an enlarged view of a probe tip portion and a periphery thereof common to FIGS. 10(A) and 10(B).

DETAILED DESCRIPTION

In an embodiment of the subject matter, in FIG. 2(A), a longitudinal direction of arm portions is referred to as a front-back direction (X direction) in which a pedestal portion side is front while a connecting portion side is back, a thickness direction of a plate-like probe is referred to as a right-left direction (Y direction), and an up-down direction in which a probe tip portion extends is referred to as an up-down direction (Z direction) in which a tip end side of a probe tip is lower.

However, the aforementioned up-down direction differs from a real up-down direction with the posture of a device under test attached in a testing system into which an electrical connecting apparatus has been incorporated. Accordingly, an up-down direction in an embodiment of the subject matter may be the real up-down direction, a horizontal direction, a diagonal direction inclined to the horizontal direction, or an upside-down direction in accordance with the posture of the device under test arranged in the testing system.

EXAMPLE 1

Figure 1:
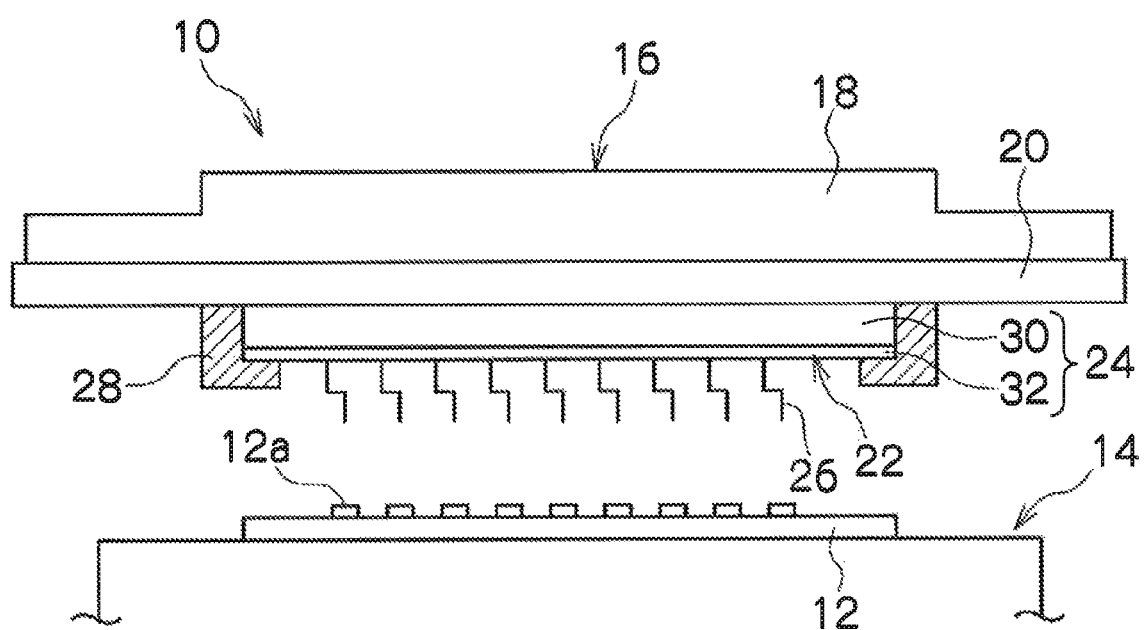
FIG. 1 is a schematic view of an embodiment of an electrical connecting apparatus having electrical test probes according to an embodiment of the subject matter illustrating a part thereof by being cut cross-sectionally.

Referring to FIG. 1, an embodiment of a testing system 10 is used in an electrical test in which plural integrated circuits formed on a semiconductor wafer as flat-plate-like devices under test 12 are tested at a time or in several batches. Each device under test 12 has plural electrodes 12a on an upper surface thereof.

The testing system 10 includes a chuck top 14 removably holding the device under test 12 in a state where the electrodes 12a are directed upward and an electrical connecting apparatus 16 electrically coupling the device under test 12 mounted on the chuck top 14 to an electrical circuit for the test.

Electrical signals for the test include test signals (voltage, current) to be supplied to the device under test 12 (integrated circuit) for the purpose of obtaining response signals and the response signals from the device under test 12 (integrated circuit) in return for the electrical signals.

The chuck top 14 is installed on a known test stage and has an upper surface removably holding the device under test 12 in a state where the electrodes 12a are directed upward. An exemplary method for holding the device under test 12 to the chuck top 14 can be vacuum adsorption.

The chuck top 14 and the electrical connecting apparatus 16 are relatively moved three-dimensionally in three directions, that is, within an XY plane extending in the X and Y directions and in the Z direction perpendicular to the XY plane, and are rotated angularly relatively around a θ axis extending in the Z direction. In general, the chuck top 14 is moved three-dimensionally and rotated angularly relatively around the θ axis with respect to the electrical connecting apparatus 16.

The electrical connecting apparatus 16 includes a reinforcing member 18 having a flat lower surface, a circular flat-plate-like wiring board 20 held on the lower surface of the reinforcing member 18, a probe assembly 22 arranged on a lower surface of the wiring board 20, and an attaching ring 28 attaching the probe assembly 22 to the wiring board 20. The probe assembly 22 includes a circular flat-plate-like probe board 24 arranged on the lower surface of the wiring board 20 and a plurality of probes 26 arranged on a lower surface of the probe board 24. The probe board 24 is attached to the lower surface of the wiring board 20 by the attaching ring 28.

The reinforcing member 18 is a known one made of a metal material such as a stainless steel plate (for example, refer to Japanese National Patent Appln. Public Disclosure No. 2008-145238, which is incorporated by reference). Such a reinforcing member 18 has an external annular portion having an approximately equal diameter dimension to that of the probe board 24, an internal attaching portion extending in a circumferential direction inside the annular portion, a plurality of connecting portions integrally coupling the annular portion with the attaching portion, and a plurality of extending portions extending outward in a radial direction from the annular portion. In the example shown in the figure, the reinforcing member 18 is shown in a state where a part inside the annular portion is projected upward.

The wiring board 20 is a known wiring board made of an electrical insulating resin such as a glass-containing epoxy resin in a circular plate shape in the example shown in the figure. Such a wiring board 20 has at an outer circumferential portion on an upper surface a plurality of first terminals (not shown) to be electrically coupled to the aforementioned electrical circuits for the test so as to transmit and receive the test signals to and from the electrical circuits for the test and has inside a plurality of conductive paths (not shown) coupled to these terminals.

The wiring board 20 also has on the lower surface a plurality of second terminals (not shown) to be electrically coupled to the probe board 24. Each second terminal is electrically coupled to the aforementioned conductive path.

The probe board 24 has a ceramic board 30 made of a ceramic in a circular flat-plate shape and a flexible multilayer sheet 32 made of an electrical insulating resin such as a polyimide resin in a circular flat-plate shape and layered on a lower surface of the ceramic board 30 in the example shown in the figure.

The aforementioned probe board 24 has inside a plurality of wires (not shown) electrically connected to the second terminals of the wiring board 20 and has on the lower surface a plurality of probe lands (not shown) electrically coupled to these internal wires. Each probe 26 is attached to the probe land in a state of extending at least downward.

The reinforcing member 18 and the wiring board 20 are coaxially coupled by a plurality of screw members (not shown) in a state where the lower surface of the reinforcing member 18 and the upper surface of the wiring board 20 abut on each other. On the other hand, the probe board 24 is attached to the lower surface of the wiring board 20 with use of the attaching ring 28 and a plurality of screw members (not shown) so that the probes 26 are on a lower side.

An electrical connector may be arranged between the wiring board 20 and the probe board 24 to electrically couple the conductive paths of the wiring board 20 to the internal wires of the probe board 24 by the electrical connector. As such an electrical connector, a known one described in Japanese National Patent Appln. Public Disclosure No. 2008-145238, which is incorporated by reference, can be used.

Each probe 26 has a flat-plate-like probe main body portion 34 made of a metal material such as nickel or a nickel-chromium alloy and a probe tip portion 36 made of a hard metal material such as rhodium as shown in FIG. 2. Both 34 and 36 show relatively favorable conductivity. The probe main body portion 34 made of nickel or a nickel-chromium alloy is greater in resiliency than rhodium constituting the probe tip portion 36 while the rhodium is higher in hardness than the metal material constituting the probe main body portion 34.

The probe main body portion 34 may be made of a highly resilient metal material with excellent resiliency such as a nickel alloy such as a nickel-phosphorus alloy, a nickel-tungsten alloy, or a nickel-cobalt alloy, phosphor bronze, or a palladium-cobalt alloy, instead of the aforementioned metal material. Also, the probe tip portion 36 may be made of a highly hard metal material other than rhodium. In a case where the probe tip portion 36 is made of a metal material that is harder than rhodium, the probe main body portion 34 may be made of rhodium.

The probe main body portion 34 includes a rectangular attaching portion 38 whose front-back direction is the length direction, a connecting portion 40 extending downward from one side of a rear side of the attaching portion 38, arm portions 42 and 42 extending to a front side from the connecting portion 40 below a lower edge of the attaching portion 38, and a pedestal portion 44 coupled to extending ends of the arm portions 42 and 42, as shown in FIG. 2(A). In the present embodiment, the probe 26 is a plate-like probe formed in a crank shape. The attaching portion 38 is bonded at an upper edge to the aforementioned probe land by a hot-melt bonding material such as solder and is attached to the probe board 24 in a cantilevered manner.

In the example shown in the figure, the arm portions 42 and 42 extend in parallel to be spaced from each other in a height direction (up-down direction) of the attaching portion 38, and the pedestal portion 44 coupling the extending ends of both the arm portions 42 and 42 extends to an opposite side (that is, to a lower side) of a side at which the attachment portion 38 is located, seen from the arm portion pair 42. The probe tip portion 36 is buried at a part thereof and supported in a lower portion of the pedestal portion 44.

Figure 3A:
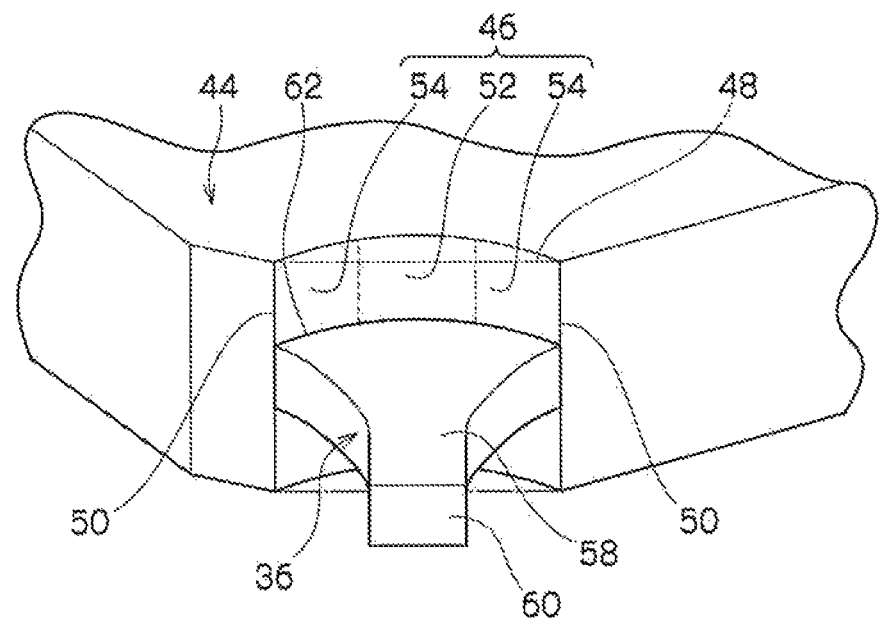
FIGS. 3(A) and 3(B) are enlarged perspective views each illustrating a probe tip portion of the probe shown in FIG. 2 and a periphery thereof.
Figure 3B:
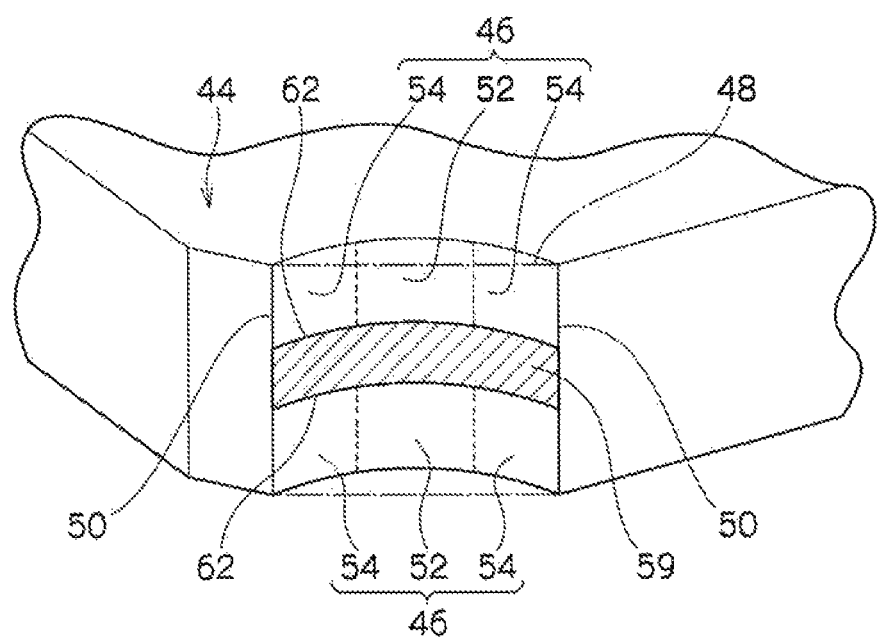
Figure 4:
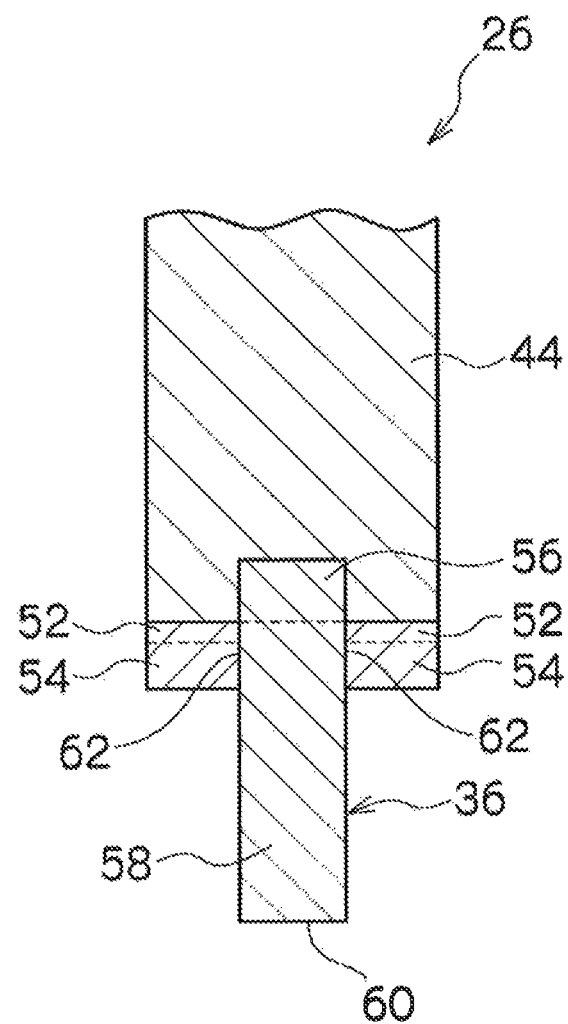
FIG. 4 is an enlarged cross-sectional view of the probe tip portion and a periphery thereof obtained along the line 4-4 in FIG. 2(A).

The pedestal portion 44 includes on a lower edge thereof a recess 46 opened downward and in the right-left direction as shown in FIGS. 2 to 4. In the recess 46, a virtual surface opened downward is regarded as a rectangular open surface 48, and both ends of the open surface 48 in the front-back direction are regarded as open ends 50. The recess 46 is defined by a central area 52 opposed to the open surface 48 and two lateral areas 54 and 54 continuing into ends of the central area 52 in the front-back direction and reaching the open ends 50 from the central area 52. In the example shown in the figures, a zone of the central area 52 and the lateral areas 54 and 54 of the recess 46 is in an arc in a direction in which the central area 52 and the lateral areas 54 and 54 are arranged.

The probe tip portion 36 has a coupling portion 56 coupled with the pedestal portion 44 by being buried in the pedestal portion 44, an extending portion 58 continuing into the coupling portion 56 and extending downward, and a tip end 60 contacting on the electrode 12a as a lower end of the extending portion 58, as shown in FIG. 4. In the probe tip portion 36, a rectangular surface defined by four sides contacting the recess 46 is regarded as a border surface 59 between the coupling portion 56 and the extending portion 58, and thereby a pair of sides spaced in a thickness direction (that is, the right-left direction) of the pedestal portion 44 out of the four sides forming the border surface 59 is defined as a pair of border portions 62 and 62 against the pedestal portion 44, as shown in FIG. 3.

In the present embodiment, since the central area 52 and the lateral areas 54 collectively form one arc surface continuously extending in the front-back direction or a first direction in which the central area 52 and the lateral areas 54 are arranged, the border portions 62 and 62 are curves continuously extending from one open end 50 to the other open end 50 along the central area 52 and the lateral areas 54. Also, the extending portion 58 is located at the aforementioned zone of the central area 52 and the lateral areas 54 and 54 of the recess 46, and the probe tip portion 36 is perpendicular to an inner surface of the recess 46 and is located at a center of the inner surface in a second direction perpendicular to the aforementioned first direction of the inner surface.

In this manner, in a case where each of the border portions 62 is a longer line segment than a virtual line linearly coupling one open end 50 to the other open end 50, a bending force acting on the border portions 62 is dispersed more than in a case where the virtual line linearly coupling both the open ends 50 is a border portion, and thus concentration of the force acting on the border portions 62 is alleviated. Consequently, the probe tip portion 36 is prevented from being broken at the border portions 62.

In the present embodiment, each of the border portions 62 and 62 is a curve extending from one open end 50 to the other open end 50 with no corners. Accordingly, the probe tip portion 36 can receive the bending force by dispersing the force uniformly without being influenced by concentration of forces generally occurring on corners. The extending portion 58 is formed approximately at the center of the recess 46 in the right-left direction in the present embodiment but may be formed on either side of the recess 46 in the right-left direction.

Figure 5:
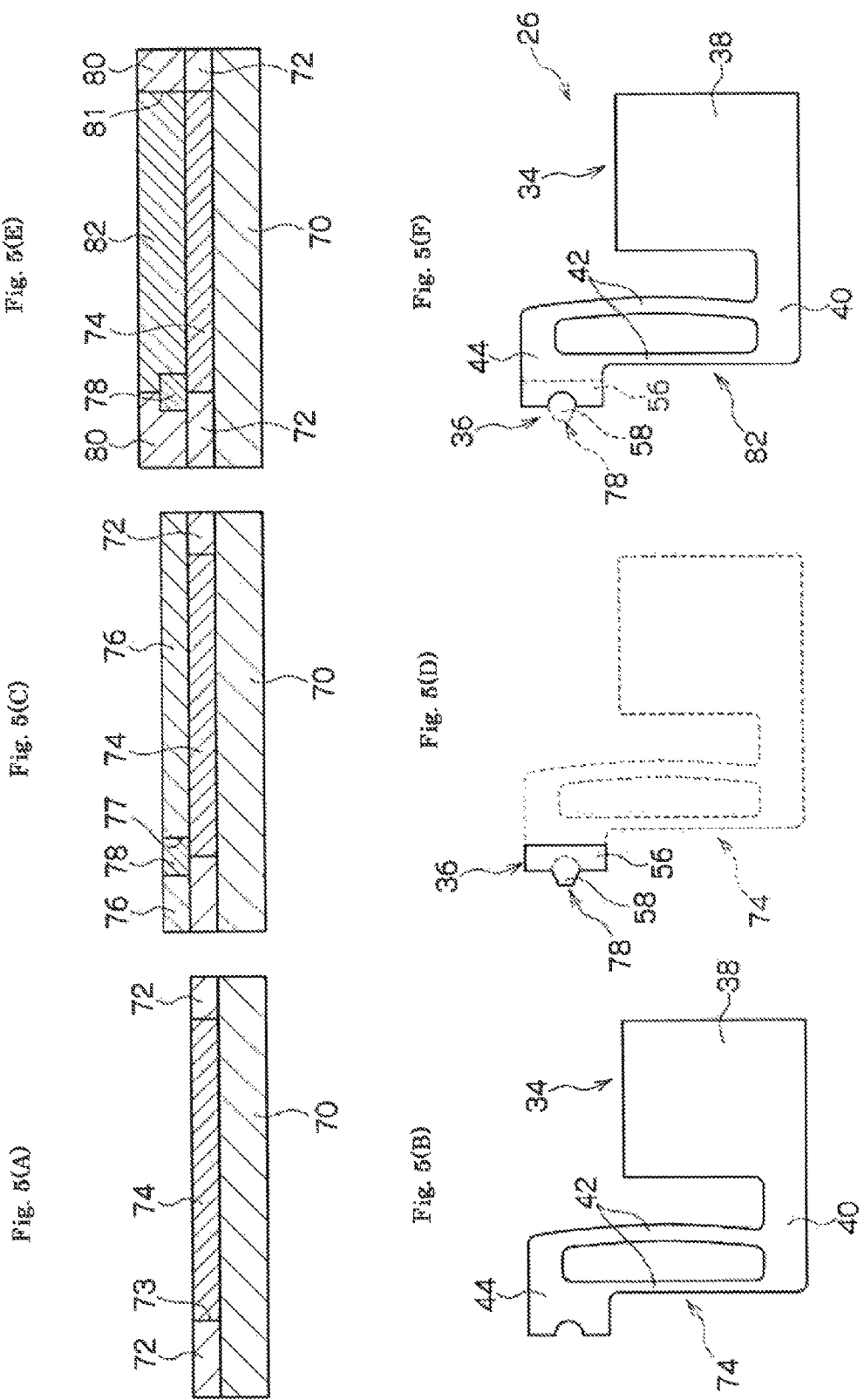
FIGS. 5(A) to 5(F) are schematic views illustrating a process for manufacturing the electrical test probe according to an embodiment of the subject matter.

An embodiment of a method for manufacturing the probe 26 will be described below with reference to FIG. 5.

First, as shown in FIG. 5(A), a photomask 72 is formed on a base table 70 having a flat surface made of stainless steel by a conventionally well-known selective exposure and development process to a photoresist layer. The photomask 72 has a recess 73 taking the form of a main body part on one side in a thickness direction (that is, the right-left direction) of the probe main body portion 34.

Subsequently, as shown in FIG. 5(A), in a surface part (that is, the recess 73) of the base table 70 exposed from the photomask 72 is deposited a highly resilient metal material 74 such as nickel chrome by an electroplating method. By this deposition of the metal material 74, part of the probe main body portion 34 having the attaching portion 38, the connecting portion 40, the pair of arm portions 42, and the pedestal portion 44 is formed on the base table 70 to have a thickness that is approximately one-third of a thickness dimension of the probe main body portion 34, as shown in FIG. 5(B).

Subsequently, as shown in FIG. 5(C), a photomask 76 having a recess 77 for the probe tip portion 36 is formed on the photomask 72 and the metal material 74. The recess 77 is formed to partially expose a predetermined area corresponding to a flat surface shape of the probe tip portion 36 out of the photomask 72 and the metal material 74.

Subsequently, in an area (that is, the recess 77) exposed from the photomask 76 is deposited a highly hard metal material 78 such as rhodium with a predetermined thickness by an electroplating method. By this deposition of the metal material 78, the coupling portion 56 and the extending portion 58 of the probe tip portion 36 are formed on the photomask 72 and the metal material 74, respectively, as shown in FIG. 5(D).

Subsequently, the photomask 76 is removed, and a photomask 80 is newly formed as shown in FIG. 5(E). The photomask 80 has a recess 81 that exposes an area corresponding to a flat surface shape of the probe main body portion 34 out of the metal material 74 and the highly hard metal material 78 in order to form a remaining part of the probe main body portion 34. In an area (that is, the recess 81) exposed by the photomask 80 is deposited a highly resilient metal material 82 similar to the aforementioned one.

As a result of the above, the remaining part of the probe main body portion 34 is formed, and the probe 26 having the probe main body portion 34 and the probe tip portion 36 as shown in FIGS. 2 to 4 is formed on the base table 70, as shown in FIG. 5(F).

Subsequently, after the photomasks 72 and 80 surrounding the probe 26 are removed, the probe 26 is detached from the base table 70.

As described above, in the probe 26 manufactured by a photolithographic technique and a deposition technique such as deposition of a metal material by an electroplating method, at least the pedestal portion 44, the extending portion 58, and the coupling portion 56 can be formed in plate shapes. One probe is manufactured in one manufacturing process in the above description, but actually a plurality of probes are typically manufactured in one manufacturing process.

A problem occurring in a case where multiple chip areas (devices under test 12) on a wafer undergo an electrical test per chip area in several batches with use of the electrical connecting apparatus 16 including the aforementioned multiple probes 26 will be described below with reference to FIG. 6.

Figure 6:
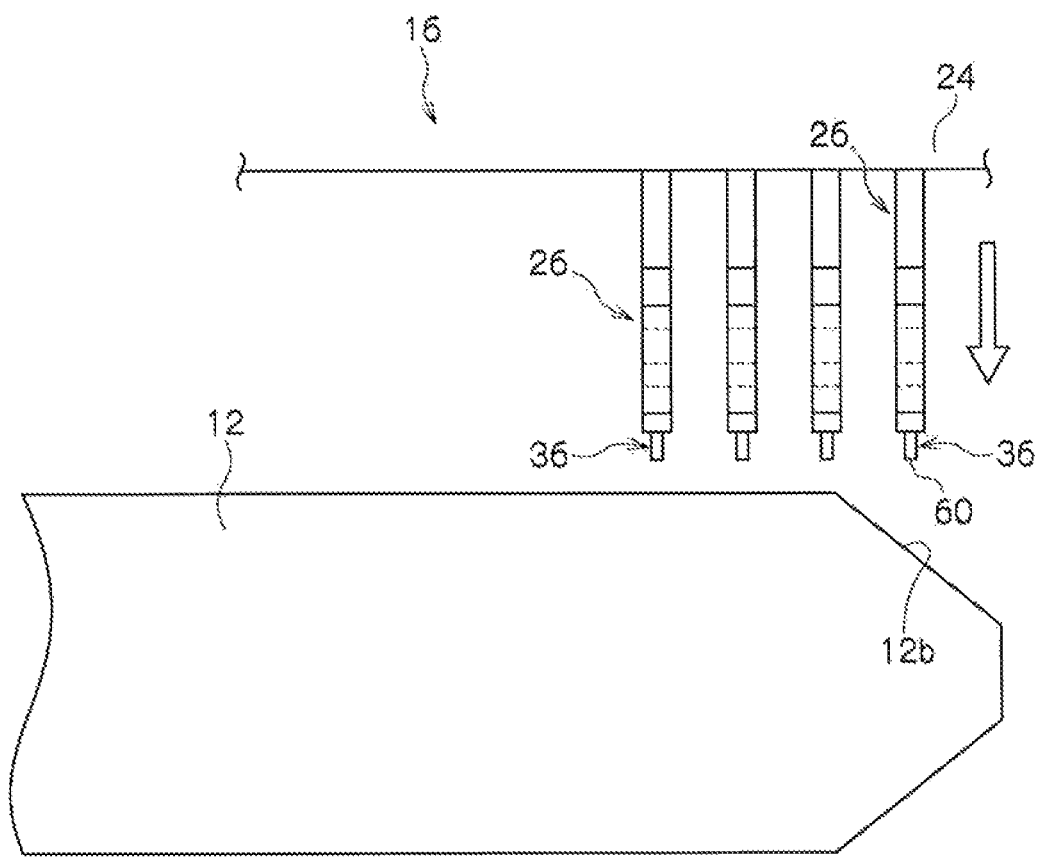
FIG. 6 is a schematic view illustrating relationship between a semiconductor wafer to be tested by the electrical connecting apparatus shown in FIG. 1 and the probes.

As shown in FIG. 6, there is a case in which some probes 26 deviate from the chip area and in which the probe tip portions 36 of the probes 26 contact a tilting edge 12b of the device under test 12.

When the probe tip (tip end) of each probe 26 is thrust to the device under test 12 by an overdriving force that causes elastic deformation of the arm portions 42 in such a state, the probe tip portion 36 of the probe 26 corresponding to the tilting edge 12b is thrust in the thickness direction (right-left direction) of the probe 26 by the tilting edge 12b. Due to this thrusting force, the probe tip portion 36 of this probe 26 receives a relatively strong bending force in the right-left direction.

However, in the probe 26 according to an embodiment of the subject matter, since each of the border portions 62 is formed in an arc in a direction in which the central area 52 and the lateral areas 54 of the recess 46 are arranged, the arc-like border portion 62 is longer than in a case where the border portion is linear. Accordingly, even when the probe tip portion 36 receives the force (the aforementioned bending force) in the right-left direction, the bending force is dispersed and acts on the entire areas of the long border portions 62. Consequently, concentration of the force acting on the border portions 62 is alleviated, and the probe 26 is prevented from being broken at the border portions 62.

Especially, in a case where the recess 46 is an arc-like recess opened to the tip end side of the probe tip portion 36 as in the above probe 26, concentration of the force acting on the border portions 62 is alleviated more, and the probe 26 is prevented from being broken at the border portions 62, based on the following analysis results.

EXAMPLE ANALYSIS RESULT 1

A result of analyzing stress acting in a case where a probe receives a bending force in a thickness direction (that is, the right-left direction) of the pedestal portion will be described with reference to schematic views in FIG. 7.

Figure 7A:
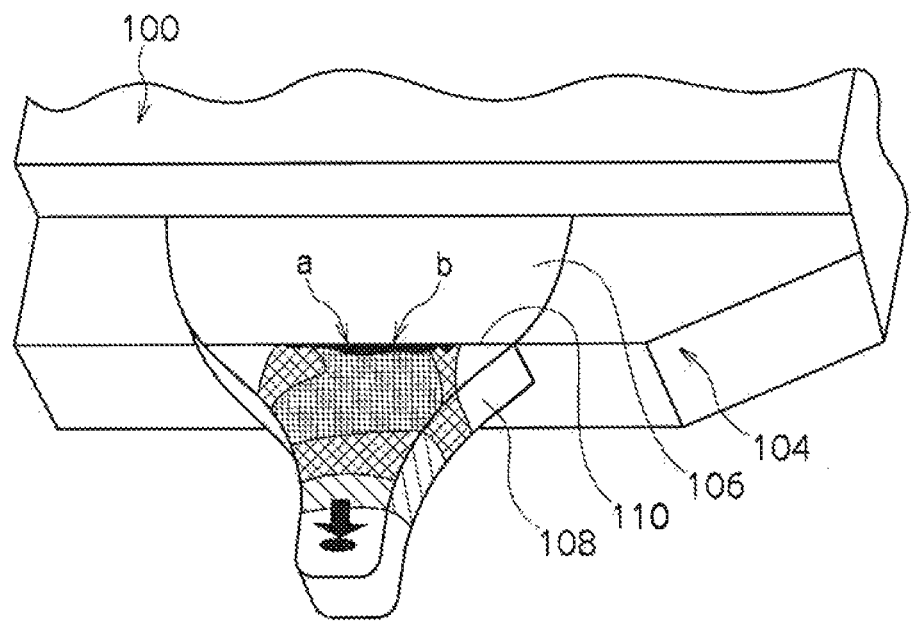
FIGS. 7(A) and 7(B) each illustrates a distribution of stress generated in a case where a force in a right-left direction is applied to a probe tip portion.
Figure 7B:
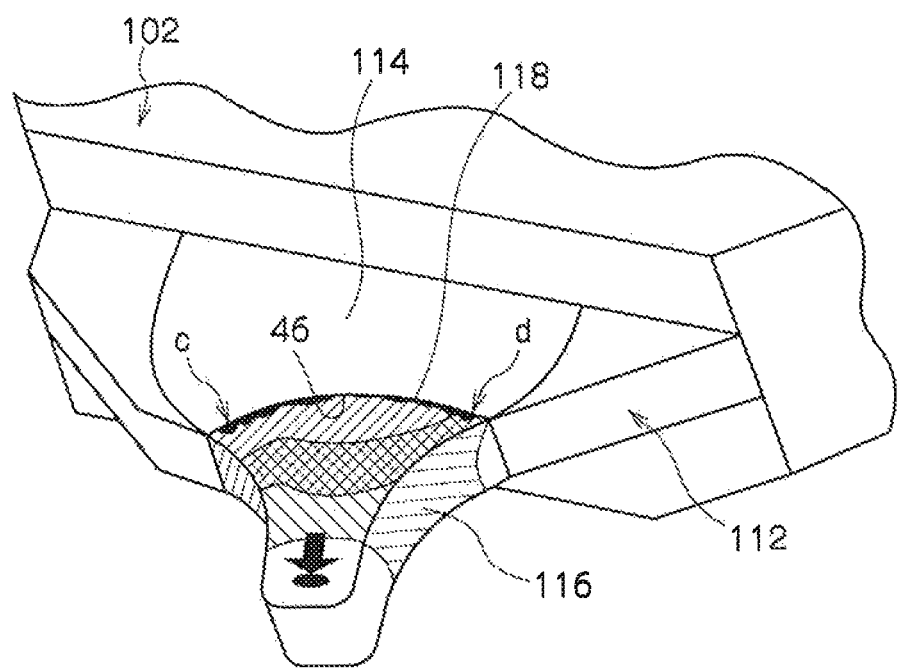

FIG. 7(A) illustrates an example analysis result of a conventional probe 100 whose border portion 110 between a pedestal portion 104 and an extending portion 108 is in a linear manner while FIG. 7(B) illustrates an example analysis result of a probe 102 whose border portion 118 between a pedestal portion 112 and an extending portion 116 has the arc-like recess 46 as in the foregoing description.

The aforementioned bending force is generated in a case where the overdriving force as shown in FIG. 6 acts on the probes 26 in a state where the tip ends 60 of some probes 26 that deviate from the chip area contact the tilting edge 12b of the wafer or in a state where the probe tip of the probe 26 contacts an edge of an opening edge portion, which exposes the electrode, of a passivation film covering a surface of the wafer.

In FIG. 7, each solid black arrow represents a direction of the bending force, a tip of the solid black arrow represents a force point of the bending force, and hatched parts and solid black parts represent a strength distribution of stress acting by the bending force. A hatched part having a higher line density has larger stress, and the solid black part has the largest stress (in other words, a part that looks like darker black has larger stress). It is to be noted that the bending force acts in the Y direction here.

As shown in FIG. 7(A), a probe tip portion of the conventional probe 100 includes a coupling portion 106 coupled with the pedestal portion 104, the extending portion 108 extending from the coupling portion 106, and the border portion 110 defined by the pedestal portion 104 and the extending portion 108. The border portion 110 of the probe 100 resides in a linear manner at a border between the pedestal portion 104 (actually, the coupling portion 106) and the extending portion 108.

When this probe 100 receives the aforementioned bending force, the bending force acts on the extending portion 108 and the border portion 110 since the probe tip portion is supported at the coupling portion 106 by the pedestal portion 104. Especially as for the border portion 110, as shown as the solid black part, a concentrated strong force acts on a center portion of the border portion 110. In general, the probe 100 is broken at such a part at which stress is concentrated. Stress values occurring at the border portion 110 were 11773 MPa and 12083 MPa at points (a) and (b), respectively, in a case where the bending force acted on the aforementioned force point of the bending force, and where this force point was displaced by 5 μm, and the stress value occurring in the probe 100 was the largest at the point (b).

On the other hand, as shown in FIG. 7(B), a probe tip portion of the probe 102 having the aforementioned arc-like recess 46 includes a coupling portion 114 coupled with the pedestal portion 112, the extending portion 116 extending from the coupling portion 114, and the border portion 118 between the pedestal portion 112 and the extending portion 116, in a similar manner to that of the probe tip portion of the probe 100. However, since the probe 102 has the arc-like recess 46 at the pedestal portion 112, the probe 102 differs from the probe 100 having the linear border portion in that the border portion 118 is in an arc by the pedestal portion 112 and the extending portion 116.

When this probe 102 receives the same bending force as the bending force that the probe 100 has received, the bending force acts on the extending portion 116 and the border portion 118 in a similar manner to that of the aforementioned probe 100. Especially, a strong force acts on the border portion 118, as shown as the solid black part.

However, a strength distribution of the force acting on the border portion 118 differs from one in the case of the aforementioned probe 100, and the solid black parts spread along the entirety of the border portion 118 in a scattered manner. Also, stress values were 6882 MPa and 7404 MPa at points (c) and (d), respectively, in a case where the same bending force as one acting on the probe 100 acted. The stress value occurring in the probe 102 was the largest at the point (d), but the stress value at the point (d) is smaller than the stress values at the points (a) and (b) of the probe 100.

As is apparent from the above analysis result, when the probe 100 receives the aforementioned bending stress, the bending force acting on the probe 100 is concentrated on the center portion of the border portion 110, whose distance from the force point is the shortest, out of the border portion 110.

On the other hand, in the case of the probe 102, since the border portion 118 is in an arc opened to the tip end side of the probe tip portion 36, variation among distances from the force point to respective points on the border portion 118 is smaller than the corresponding variation among distances in the case of the probe 100. Thus, when the aforementioned bending force acts on the probe 102, the bending force acting on the probe 102 is dispersed and acts on the respective points on the border portion 118.

As a result of the above, the maximum stress values occurring in the probes 100 and 102 are 12083 MPa and 7404 MPa, respectively. The maximum stress acting on the probe 102 is smaller than the maximum stress acting on the probe 100 since the bending force is dispersed and acts on the probe 102.

The above analysis results have clearly demonstrated that the probe 102 is prevented from being broken more reliably than the probe 100 when the aforementioned bending force acts on the probe 102.

EXAMPLE ANALYSIS RESULT 2

Next, an example result of analyzing stress acting in a case where the probe 100 or 102 further receives a second bending force in the front-back direction (X direction) in a state of receiving the overdriving force will be described with reference to schematic views in FIG. 8.

Figure 8A:
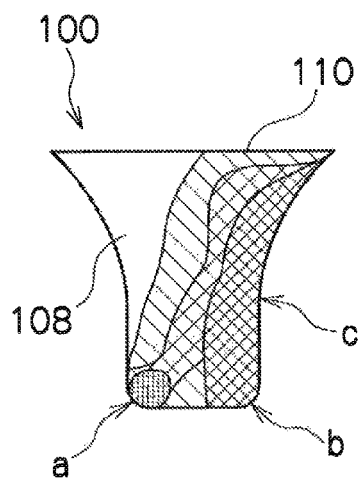
FIGS. 8(A) to 8(D) each illustrates a distribution of stress generated in a case where a force in a front-back direction is applied to the probe tip portion in a state where an overdriving force acts on a probe.
Figure 8C:
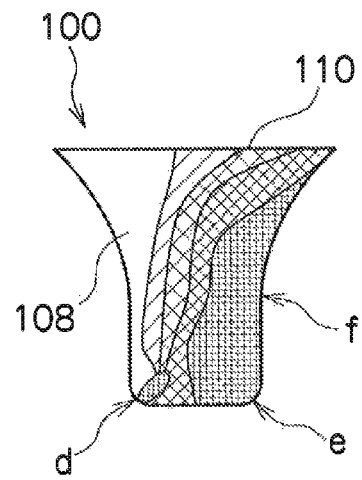
Figure 8B:
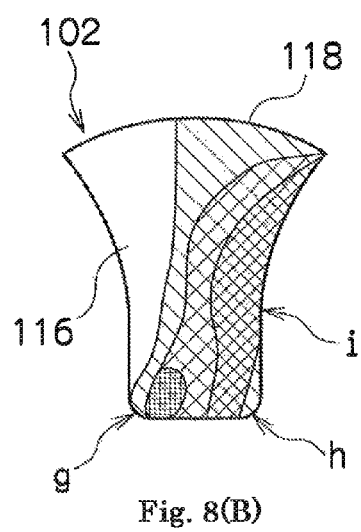
Figure 8D:
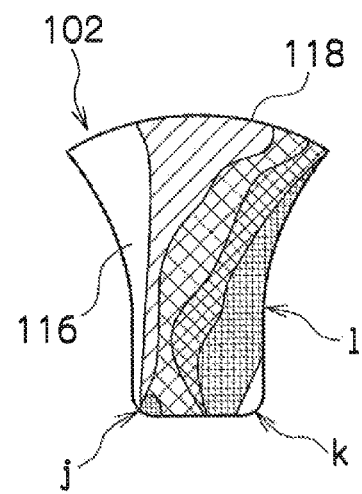

FIGS. 8(A) and 8(C) illustrate example analysis results of the conventional probe 100 having the linear border portion 110 while FIGS. 8(B) and 8(D) illustrate example analysis results of the probe 102 having the arc-like border portion 118.

In FIG. 8, hatched parts represent a strength distribution of stress generated by the second bending force. A hatched part having a higher line density has a larger stress value (in other words, a part that looks like darker black has a larger stress value). Also, FIGS. 8(A) to 8(D) are schematic plan views illustrating only the extending portion 108 and the border portion 110 in terms of the probe 100 and only the extending portion 116 and the border portion 118 in terms of the probe 102.

FIGS. 8(A) and 8(B) are analysis results of the probes 100 and 102, respectively, in a case where an overdriving amount is 80 μm while FIGS. 8(C) and 8(D) are analysis results of the probes 100 and 102, respectively, in a case where the overdriving amount is 160 μm. In other words, the probes 100 and 102 are compared with the overdriving amount of 80 μm in FIGS. 8(A) and 8(B) while the probes 100 and 102 are compared with the overdriving amount of 160 μm in FIGS. 8(C) and 8(D).

When FIGS. 8(A) and 8(B) are compared, stress values at a point (a) and at a corresponding point (g) were 388 MPa and 479 MPa, respectively, stress values at a point (c) and at a corresponding point (i) were 509 MPa and 528 MPa, respectively, and stress values at a point (b) and at a corresponding point (h) were 433 MPa and 426 MPa, respectively. As is apparent from these values, the stress values at the corresponding points were nearly equal. Also, as shown in FIGS. 8(A) and 8(B), the strength distributions of the stress were similar distributions at the extending portions 108 and 116.

When FIGS. 8(C) and 8(D) are compared, stress values at a point (d) and at a corresponding point (j) were 413 MPa and 388 MPa, respectively, stress values at a point (e) and at a corresponding point (k) were 606 MPa and 642 MPa, respectively, and stress values at a point (f) and at a corresponding point (l) were 844 MPa and 812 MPa, respectively. As is apparent from these values, the stress values at the corresponding points were nearly equal. Also, as shown in FIGS. 8(C) and 8(D), the strength distributions of the stress were similar distributions at the extending portions 108 and 116.

That is, the analysis results in FIG. 8 have clearly demonstrated that the stress values occurring in the probes 100 and 102 by the overdriving force and the second bending force have almost no difference between the conventional probe 100 and the probe 102 according to an embodiment of the subject matter.

In the above analysis results 1 and 2, the analysis results in FIGS. 7 and 8 have clearly demonstrated that the probe 102 is prevented from being broken more reliably than the probe 100 in terms of the aforementioned bending force (force in the right-left direction) and that there is no difference between the probes 102 and 100 in terms of the aforementioned second bending force (force in the front-back direction). This has clearly demonstrated that the probe 102 is more advantageous than the probe 100 with respect to an object to prevent breakage of the probe tip portion.

OTHER EXAMPLES

FIGS. 9(A) to 9(D) illustrate modification examples of the probe 26 having the border portion 62 formed by the recess 46 and the extending portion 58. Probes 26a and 26b shown in FIGS. 9(A) and 9(B) have a semicircular arc-like border portion 62a and a V-shaped border portion 62b, respectively. The border portion 62a (or 62b) extends from one open end 50 to the other open end 50 of a recess 46a (or 46b), and an extending portion 58a (or 58b) is formed to extend from an entire area of a central area 52a (or 52b) and lateral areas 54a (or 54b) of the recess 46a (or 46b).

Figure 9A:
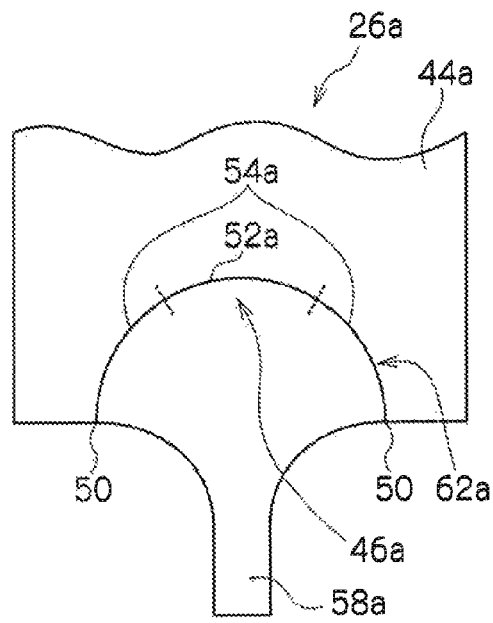
FIGS. 9(A) to 9(D) are enlarged schematic views illustrating various shapes of recesses and extending portions according to other embodiments of the electrical test probe according to an embodiment of the subject matter.
Figure 9B:
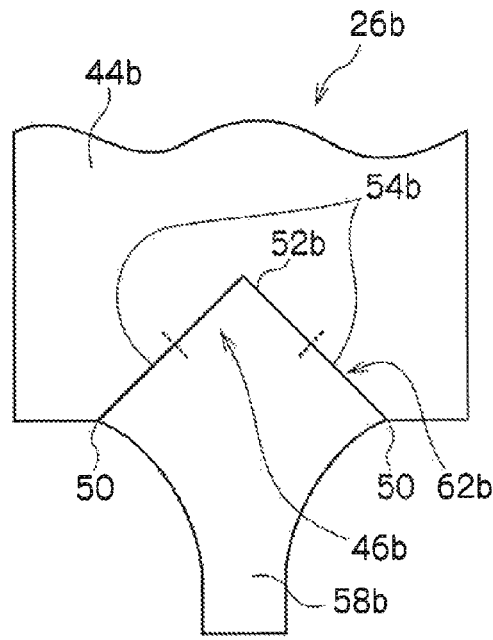
Figure 9C:
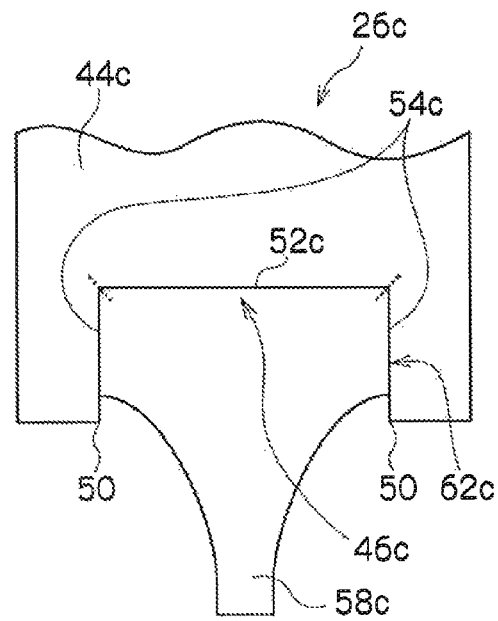
Figure 9D:
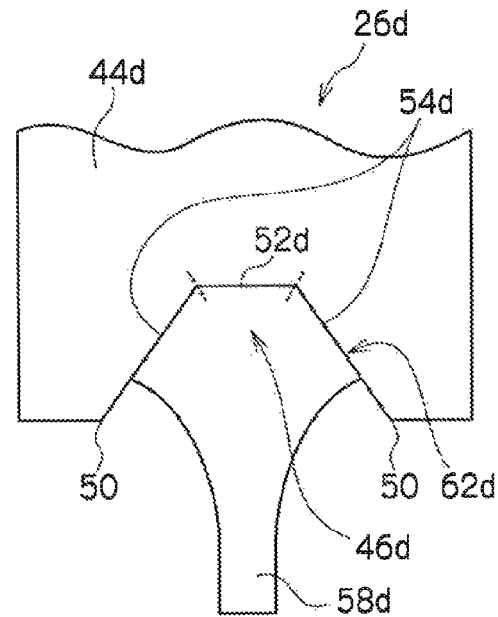

Probes 26c and 26d shown in FIGS. 9(C) and 9(D) have a U-shaped border portion 62c in which lateral areas 54c and 54c constituting a pair are parallel and a U-shaped border portion 62d in which a distance between lateral areas 54d and 54d constituting a pair is shorter further on the back side of a recess, respectively. The border portion 62c (or 62d) extends from a midstream of one lateral area 54c (or 54d) to a midstream of the other lateral area 54c (or 54d), and an extending portion 58c (or 58d) is formed to extend from a retreating part of a recess 46c (or 46d) in a back direction.

In the probe 26a or 26b, the extending portion 58a or 58b may be formed to extend from a retreating part of the recess 46a (or 46b) in a back direction in a similar manner to that of the probe 26c or 26d shown in FIG. 9(C) or 9(D). Also, in the probe 26c or 26d, the extending portion 58c or 58d may be formed to extend from an entire area of the recess 46c (or 46d) in a similar manner to that of the probe 26a and 26b shown in FIG. 9(A) or 9(B). Also, as for the recess 46, the border portion 62 may be in another shape such as a W shape. That is, the extending portion 58 (58a, 58b, 58c, 58d) of the probe tip portion 36 has only to be located at the central area 52 (52a, 52b, 52c, 52d) and at either one of the lateral areas 54 (54a, 54b, 54c, 54d).

An embodiment of the subject matter can be applied not only to the probe 26 attached in a cantilevered manner as shown in FIG. 2 but also to a conventionally well-known vertical probe 120 and a conventionally well-known spiral spring probe 122 as shown in FIGS. 10(A) and 10(B). These probes 120 and 122 are manufactured by a photolithographic technique, a deposition technique, and a process technique such as a laser process in a similar manner to that of the probe 26.

The vertical probe 120 has a probe main body portion 124 curved either in the front-back direction or in the right-left direction and a probe tip portion 126 extending from a lower end of the probe main body portion 124. The probe main body portion 124 includes a pedestal portion 128 having a similar shape to that of the pedestal portion 44 of the probe 26. The probe tip portion 126 extends downward from a lower end of the pedestal portion 128.

The spiral spring probe 122 has a probe main body portion 130 formed in a spiral shape and a probe tip portion 132 extending from a lower end of the probe main body portion 130. The probe main body portion 130 includes a pedestal portion 134 having a similar shape to that of the pedestal portion 44 of the probe 26 or that of the pedestal portion 128 of the vertical probe 120. The probe tip portion 132 extends downward from a lower end of the pedestal portion 134.

The probe tip portion and a peripheral area thereof, which are common to the vertical probe 120 and the spiral spring probe 122, are enlarged and shown in FIG. 10(C). The vertical probe 120 and the spiral spring probe 122 have the similar pedestal portions 128 and 134, respectively. The pedestal portions 128 and 134 respectively have recesses 136. The probe tip portion 126 (or 132) has a coupling portion 138 coupled with the pedestal portion 128 (or 134) by being buried or fitted in the pedestal portion 128 (or 134) and an extending portion 140. The extending portion 140 is formed to extend from the recess 136.

In each of the vertical probe 120 and the spiral spring probe 122, the pedestal portion 128 (or 134) and the probe tip portion 126 (or 132) have similar relationship to that of the corresponding pedestal portion 44 and probe tip portion 36 of the probe 26 as above.

An embodiment of the subject matter is not limited to the above embodiments but may be altered in various ways without departing from the spirit and scope of the disclosure.

REFERENCE SIGNS LIST ACCORDING TO AN EMBODIMENT 12 device under test
22 probe assembly
26, 100, 102 probe
34, 124, 130 probe main body portion
36, 126, 132 probe tip portion
44, 104, 112, 128, 134 pedestal portion
46, 136 recess
48 open surface
50 open end
52 central area
54 lateral area
56, 106, 114, 138 coupling portion
58, 108, 116, 140 extending portion
60 tip end
62, 110, 118 border portion
120 vertical probe
122 spiral spring probe From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A probe, comprising:
a probe main body portion including an attaching end configured to attach to a probe board, and a probe-tip-receiving end;
a recess provided at the probe-tip-receiving end of the probe main body portion and having an inner surface; and
a probe-tip portion having a part received in the recess,
wherein the inner surface has a central area and two lateral areas on both sides of the central area, and the part of the probe tip portion is located at the central area and at least at either one of the lateral areas,
wherein the central area and at least either one of the lateral areas define a border portion between the probe main body portion and the part of the probe tip portion received in the recess, and the border portion is concave-shaped such as arc-shaped, one-side open rectangular-shaped, or V-shaped along a first direction in which the central area and the lateral areas are arranged.

2. The probe according to claim 1, wherein a zone of the central area and the lateral areas at which the part of the probe-tip portion is located is in an arc along the first direction in which the central area and the lateral areas are arranged.

3. The probe according to claim 2, wherein the probe-tip portion is in a plate shape perpendicular to the inner surface, and the part of the probe-tip portion is located at a center of the inner surface in a second direction perpendicular to the first direction of the inner surface.

4. A probe assembly, comprising:
a plurality of probes wherein each probe has a respective probe main body portion including a respective attaching end configured to attach to a probe board, and a respective probe-tip-receiving end, a respective recess provided at the respective probe-tip-receiving end and having a respective inner surface, and a respective probe-tip portion having a respective part received in the respective recess and wherein the respective inner surface has a respective central area and two respective lateral areas on both sides of the respective central area, and the respective part of the respective probe-tip portion is located at the respective central area and at least at either one of the respective lateral areas;
wherein the respective central area and at least either one of the respective lateral areas define a respective border portion between the respective part of the probe tip portion and the probe main body portion, and the respective border portion is concave-shaped such as arc-shaped or one-side open rectangular-shaped or V-shaped or W-shaped along a first direction in which the respective central area and the respective lateral areas are arranged; and
a probe board to which the probes are attached.

5. An electrical test probe, comprising:
a probe main body portion;
an attaching portion configured to attach to a probe board, the attaching portion being provided at the probe main body portion;
a plate-like pedestal portion that is provided at the probe main body portion and whose right-left direction is a thickness direction; and
a probe-tip portion that extends downward from the pedestal portion and whose lower end is a tip end to contact on a device under test,
wherein the pedestal portion has a recess opened at least downward and defined by a central area opposed to an open surface thereof and lateral areas continuing into respective ends of the central area in a front-back direction and reaching open ends of the recess from the central area,
wherein the probe-tip portion is made of a harder material than that of the pedestal portion and has a coupling portion coupled with the pedestal portion by being buried or fitted in the pedestal portion and a plate-like extending portion extending downward from the recess and having a smaller thickness dimension than a thickness dimension of the recess, and
wherein the extending portion has a border portion contacting the recess from the central area to the lateral areas, and the border portion is concave-shaped such as arc-shaped, one-side open rectangular-shaped or V-shaped along the first direction in which the central area and the lateral areas are arranged.

6. The electrical test probe according to claim 5, wherein the central area and the lateral areas collectively form one arc surface extending in a front-back direction.

7. The electrical test probe according to claim 5, wherein the coupling portion is located approximately at a center of the recess in a right-left direction.

8. A probe assembly, comprising:
a probe board having a plurality of probe lands on a lower surface; and
a plurality of probes attached to the probe lands,
wherein the plurality of probes are the electrical test probes according to claim 5.

9. The probe assembly according to claim 4, wherein each probe is attached to the probe board in a cantilevered manner.

10. The probe assembly according to claim 8, wherein each probe is attached to the probe board in a cantilevered manner.

11. The probe according to claim 1, wherein a zone of the central area and the lateral areas at which the part of the probe-tip portion is located is in an arc along the first direction in which the central area and the lateral areas are arranged, or in one-side open rectangular-shaped or V-shaped along the first direction in which an angle with the central area and the lateral areas is more than perpendicular.

* * * * *